United States Patent [19]

Cosimini et al.

[11] 4,250,565
[45] Feb. 10, 1981

[54] SYMMETRICAL MEMORY PLANE FOR CROSS-TIE WALL MEMORY SYSTEM

[75] Inventors: Gregory J. Cosimini, St. Paul; Leslie H. Johnson, Minneapolis; David S. Lo, Burnsville; George F. Nelson, Coon Rapids; Maynard C. Paul, Bloomington; Ernest J. Torok, Minneapolis, all of Minn.

[73] Assignee: Sperry Corporation, New York, N.Y.

[21] Appl. No.: 20,762

[22] Filed: Feb. 23, 1979

[51] Int. Cl.³ ............................................. G11C 11/00
[52] U.S. Cl. ........................................ 365/87; 365/35; 365/81
[58] Field of Search ................................. 365/35–44, 365/81, 87

[56] References Cited

U.S. PATENT DOCUMENTS 3,689,902  9/1972  Chang et al. ........................... 365/87
4,100,609  7/1978  Schwee et al. ......................... 365/87

OTHER PUBLICATIONS

*Progress Toward the Crosstie Memory V;* Schwee et al., NSWC/WOL TR 78-11; Jan. 1978; pp. 1-17.

*Primary Examiner*—Marshall M. Curtis
*Attorney, Agent, or Firm*—Kenneth T. Grace; William Cleaver; Marshall M. Truex

[57] ABSTRACT

Disclosed is a cross-tie wall memory system for the generating, propagating and detecting of binary data represented by the presence or absence of cross-tie, Bloch-line pairs along a cross-tie wall in a thin magnetic layer. The system includes a three-level structure comprised of the following superposed layers: a straight-edged current conductive stripline; a serrated-edged thin magnetic layer data track, and a wide-narrow-edged current conductive stripline terminated on one end by a cross-tie, Bloch-line pair generator and on the other end by a cross-tie detector.

10 Claims, 14 Drawing Figures $i_{18} = i_{22} + i_s$

| FUNCTION | GENERATOR | LINES | CURRENT SIGNAL |
|---|---|---|---|
| GENERATE | 48 | 12a, 12b | 100 ns, 15 ma |
| WIDE PUSH | 60 | 18<br>22 | 10 μs, 60 ma<br>10 μs, 19 ma |
| WIDE NUCLEATE | 61 | 18 | 50 ns, 105 ma |
| NARROW ANNIHILATE | 62 | 18<br>22 | 25 μs, 62 ma<br>25 μs, 46 ma |
| DETECT | 36 | 36a, 36b | 5 μs, 5 ma |
| NARROW PUSH | 63 | 18<br>22 | 15 μs, 26 ma<br>15 μs, 13 ma |
| NARROW NUCLEATE | 64 | 18 | 50 ns, 105 ma |
| WIDE ANNIHILATE | 65 | 18<br>22 | 25 μs, 110 ma<br>25 μs, 21 ma |

SYMMETRICAL MEMORY PLANE FOR CROSS-TIE WALL MEMORY SYSTEM

The invention described herein was made in the course of, or under, a contract with the Department of the Navy.

BACKGROUND OF THE INVENTION

The propagation of inverted Néel wall sections in a serial access memory system was proposed by L. J. Schwee in the publication "Proposal On Cross-tie Wall and Bloch-line Propagation In Thin Magnetic Films," IEEE Transactions on Magnetics, MAG 8, No. 3, pages 405–407, September 1972. Such a memory system utilizes a ferromagnetic film of approximately 81% Ni-19% Fe approximately 350 Angstroms (Å) thick in which cross-tie walls can be changed to Néel walls and Néel walls can be changed to cross-tie walls by applying appropriate fields. Associated with the cross-tie walls is a section of inverted Néel wall that is bounded by a cross-tie wall on one end and a Bloch-line on the other end.

In such a cross-tie wall memory system, information is entered at one end of the serial access memory system by the generation of an inverted Néel wall section, formed by a cross-tie on one side and a Bloch-line on the other, that is representative of a stored binary 1 or of a noninverted Néel wall section (i.e., the absence of a cross-tie and Bloch-line pair) that is representative of a stored binary 0. Such information is moved or propagated along the cross-tie wall by the successive generation (and then the selective annihilation) of inverted Néel wall sections at successive memory cells along the cross-tie wall. In the D. S. Lo, et al, U.S. Pat. No. 3,906,466 there is disclosed a propagation circuit for the transfer of inverted Néel wall sections at successive memory cells along the cross-tie wall. In the L. J. Schwee U.S. Pat. No. 3,868,660 and in the publication "Cross-tie Memory Simplified by the Use of Serrated Strips," L. J. Schwee, et al, AIP Conference Proceedings, No. 29, 21st Annual Conference on Magnetism and Magnetic Materials, 1975, published April 1976, pages 624–625, and in the publication "Cross-Tie/Bloch-Line Detection," G. J. Cosimini, et al, AIP Conference Proceedings, No. 3, 23rd Annual Conference on Magnetism and Magnetic Materials, 1978, published March, 1978, pages 1828–1830, there have been published some more recent results of the further development of cross-tie wall memory systems.

In prior art cross-tie wall memory systems, the magnetic film that functions as the storage medium has the property of uniaxial anisotropy provided by its easy axis induced magnetic fields, which easy axis is generated in the magnetic film during its formation in the vapor deposition process. This easy axis provides a magnetic field induced anisotropy which constrains the generation of the cross-tie wall along and parallel to the easy axis. In the above L. J. Schwee, et al, AIP publication there are proposed serrated strips of Permalloy film, about 350 Angstroms (Å) in thickness and 10 microns (μm) in width, which serrated strips are etched from a planar layer of the magnetic material so that the strips are aligned along the easy axis of the film. After an external magnetic field is applied normal to the strip length, i.e., transverse the easy axis of the film, the magnetization along the opposing serrated edges rotates back to the nearest direction that is parallel to the edge. This generates two large domains that are separated by a Néel or cross-tie wall that is formed along the centerline of the strip. Cross-ties are energetically more stable at the necks of the serrated edges while Bloch-lines are energetically more stable in the potential wells between adjacent necks.

This serrated strip configuration, because of the contour of the opposing edges of the strip, provides the means whereby the cross-tie, Bloch-line pairs are structured at predetermined memory sections along the strip. However, because prior art strips have field induced uniaxial anisotropy imparted during deposition, such strips cannot be utilized to permit the use of nonlinear, i.e., curved, data tracks, which curved data tracks are essential to the configuration of cross-tie wall memory systems of large capacity or of digital logic function capabilities. In the L. H. Johnson, et al, U.S. Pat. No. 4,075,612 there is disclosed a design of the edge contour of a film strip of, e.g., Permalloy film of approximately 350 Å in thickness and approximately 10 μm in width. The edge contours are mirror images, one of the other, of asymmetrical, repetitive patterns of rounded edge portions. The edge contour of each opposing pair of rounded edge portions is substantially in alignment with the natural contour of the magnetization that is oriented around a Bloch-line, which Bloch-line is positioned along the cross-tie wall that is oriented along the geometric centerline of the film strip. The neck or narrowest point of the edge contour between adjacent rounded edge portions functions to structure the static or rest position of the associated cross-tie of the cross-tie, Bloch-line pair.

In the M. C. Paul, et al, U.S. Pat. No. 4,130,888 there is disclosed a cross-tie wall memory system and in particular a data track therefor that is formed of a strip of magnetic material having substantially zero magnetic field induced anisotropy. The data-track-defining-strip of isotropic material utilizes its shape, i.e., its edge contour induced, anisotropy to constrain the cross-tie wall within the planar contour and along the centerline of the film strip. Accordingly, the cross-tie wall is constrained to follow the path defined by the magnetic film strip which path may be configured into a major loop, or circular data track, configuration for large capacity memory storage.

In the E. J. Torok U.S. Pat. Nos. 4,030,591 and 4,075,613 there is utilized the data-track-defining-strip of isotropic magnetic film of the hereinabove referenced M. C. Paul, et al, patent to form a replicator of and a logic gate for cross-tie, Bloch-line pairs. The replicator is utilized as a magnetic switch or gate to selectively transfer cross-tie, Bloch-line pairs between merging, overlapping data tracks. This permits the configuration of a plurality of continuous data tracks into a major-loop, minor-loop configuration for a large capacity memory system. The logic gate is utilized as a magnetic switch to selectively perform the logic OR function or the logic AND function upon two merging, overlapping data tracks.

SUMMARY OF THE INVENTION

In the cross-tie wall memory system of the present invention there is provided a shift register for shifting cross-tie, Bloch-line pairs therealong through a plurality of memory cells consisting of a transfer section and a store section. The shift register is terminated on one end by a cross-tie, Bloch-line pair generator, for selectively coupling cross-tie, Bloch-line pairs into the shift register, and on the other end by a detector for detecting when a cross-tie has been entered therein from the shift register.

The generator/shift register/detector assembly is fabricated in three superposed layers: a straight-edged current conductive stripline; a serrated-edged thin magnetic layer that forms the data track along the geometric centerline of which is formed and structured the cross-tie wall, and a wide-narrow-edged current conductive stripline comprised of a plurality of rectangularly-shaped wide portions that are serially coupled by narrow portions therebetween that is terminated on one end by a cross-tie, Bloch-line pair generator and on the other end by a cross-tie detector. Electronic circuitry controls the drive current signals to the straight-edged stripline and/or the wide-narrow-edged stripline to generate the necessary fields for the propagation of the cross-tie, Bloch-line pairs along the serrated-edged data track, to the generator to selectively generate, or or not, cross-tie, Bloch-line pairs, and to the detector to detect the presence, or not, of a cross-tie, all in synchronism.

DESCRIPTION OF THE PREFERRED EMBODIMENT

Figure 1:
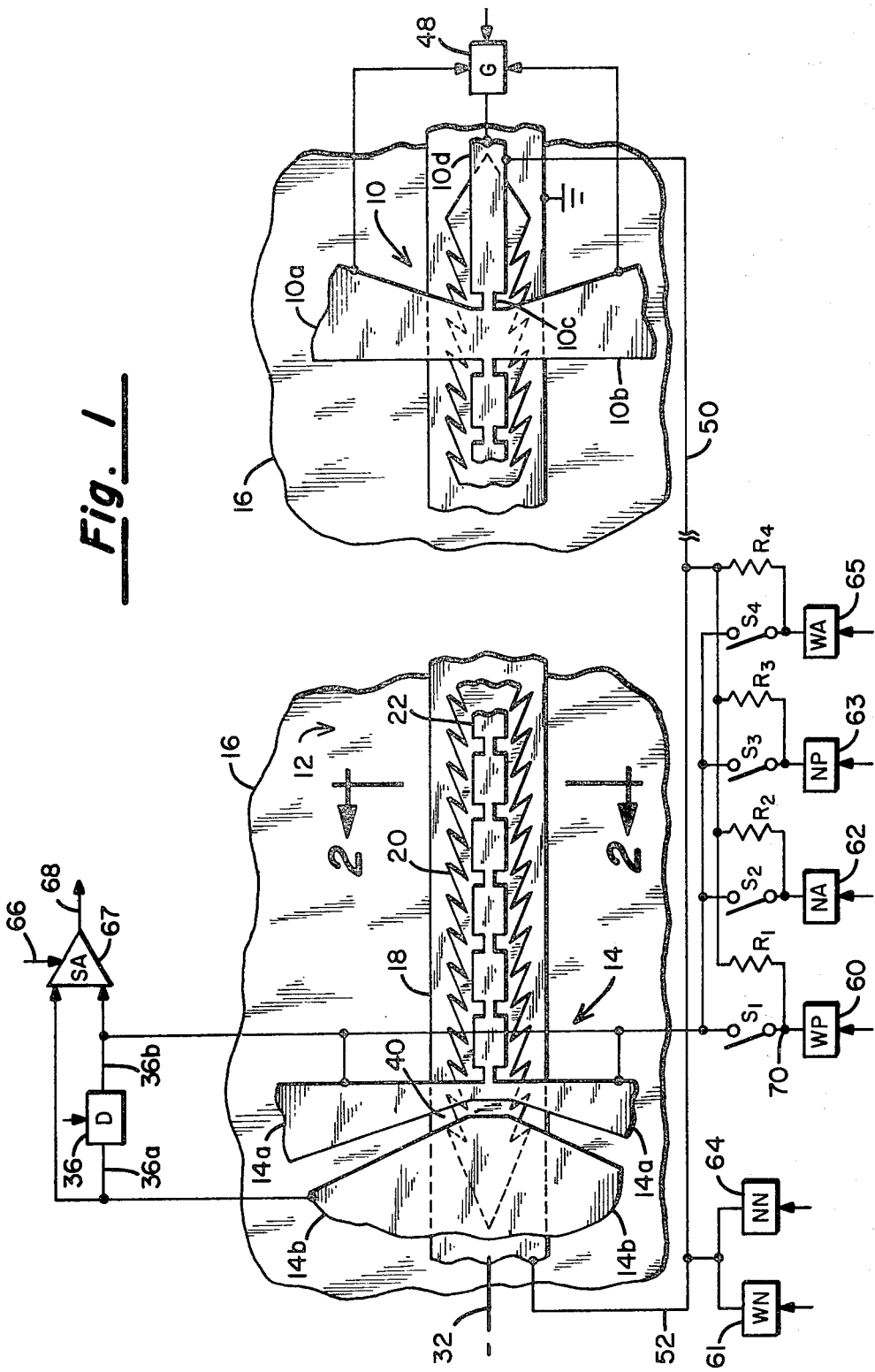
FIG. 1 is a schematic illustration of a portion of a cross-tie wall memory system illustrating, in detail, the generator/shift register/detector of the present invention.

FIG. 1 is an illustration of a portion of a cross-tie wall memory system into which the generator 10, shift register 12, and the detector 14 of the present invention have been incorporated.

Figure 2:
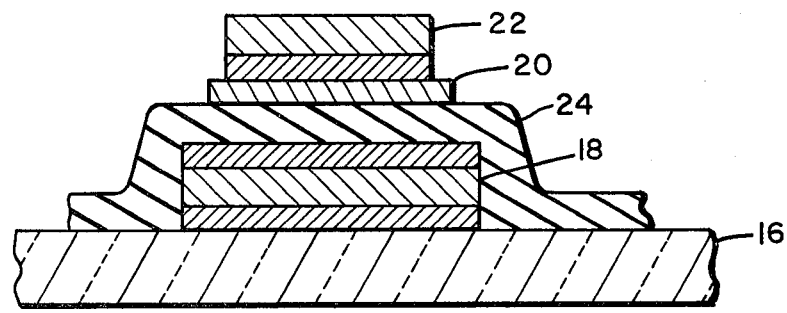
FIG. 2 is an illustration of a cross-section of the memory plane of FIG. 1 taken along line 2—2 thereof illustrating the stacked, superposed elements of FIG. 1.

FIG. 2 is an illustration of a cross-section of the memory plane of FIG. 1 taken along line 2—2 thereof for the purpose of illustrating the stacked, superposed elements of FIG. 1. The memory system of FIG. 1 includes a non-magnetizable, e.g., glass or silicon, substrate member 16 having the following active members arranged in a stacked, superposed integral assembly: conductive, e.g., gold, straight-edged stripline 18; magnetizable, e.g., NiFe, serrated-edged data track 20; and conductive, e.g., gold, wide-narrow-edged stripline 22. Not illustrated in FIG. 1, but illustrated in FIG. 2, are: a thin adhesive layer of, e.g., chromium, that may be affixed to the top and/or the bottom surfaces of the metallic layers for ensuring an integral assembly of the metallic layers with the adjacent metallic or insulating layers; and a thin, smoothing and insulating layer 24 of, e.g., SiO, between the current-conducting striplines 18 and 22. Still further, but not illustrated in either FIG. 1 or 2, superposed this entire assembly and affixed to the top surface thereof, there may be provided an additional, e.g., SiO, sealing and insulating layer.

With respect to substrate 16 and stripline 18, such configurations may be similar to that of the D. S. Lo, et al, U.S. Pat. No. 3,906,466. Additionally, with respect to data track 20, it may be configured in the manner as taught by the L. J. Schwee U.S. Pat. No. 3,868,660 and in the publication "Cross-tie Memories Simplified by the Use of Serrated Strips," L. J. Schwee, et al, AIP Conference Proceedings, No. 29, 21st Annual Conference on Magnetism and Magnetic Materials, 1975, published April, 1976, pages 624–625; or in the manner as taught by the L. H. Johnson, et al, U.S. Pat. No. 4,075,612. With respect to the particular configuration or embodiment of data track 20, it is preferably configured into a film strip whose two opposing edges are formed into mirror-imaged, repetitive patterns of successive narrow portions, transverse to centerline 32, that form wide portions therebetween between which the cross-tie, Bloch-line pairs are structured.

As is well known, such data track 20 when effected by the proper drive fields establishes a cross-tie wall along its geometric centerline which is substantially aligned with its longitudinal axis, identified as line 32 of FIG. 1. Preferably the film strip is isotropic, i.e., has substantially zero magnetic field induced anisotropy, and utilizes its shape, i.e., its edge contour, to constrain the cross-tie wall within the planar contour of and along the longitudinal axis 32. However, it is to be noted that data track 20 may be configured into a film strip whose two opposing edges are parallel, straight lines along which the positioning of the Bloch-line is structured solely by the configuration of a drive line such as taught in the E. J. Torok U.S. Pat. No. 4,075,613.

However, in the present illustrated embodiment of FIG. 1, stripline 22 is configured into a wide-narrow drive line comprised of an alternating series of wide-narrow portions, in which the wide portion is approximately three times the length of the narrow portion. The narrow portion of stripline 22 is substantially centered about the alternate, i.e., every other, narrow portions of data track 20 while the wide portion of stripline 22 is substantially centered about the other alternate narrow portions of data track 20. For purposes of the present invention, the narrow portions of data track 20 and the associated narrow portions of stripline 22 are defined as a store segment, while the narrow portions of data track 20 and the associated wide portions of stripline 22 are defined as a transfer segment—see the D. S. Lo, et al, U.S. Pat. No. 3,906,466—both combining to comprise a memory cell, a plurality of which are aligned along the data track 20, stripline 22 of FIG. 1. Thus, the generator 10 of FIG. 1 is centered about a store segment while the detector 14 is centered about a transfer segment. This will be further explained in the discussion of the operation of FIG. 1 as illustrated in FIGS. 4a through 4i and the timing diagram of FIG. 3.

With particular reference to FIG. 2, there is presented a cross-sectional view of the superposed stripline 18, data track 20 and stripline 22 of FIG. 1 taken along line 2—2 thereof for the purpose of illustrating the configuration of the stacked, superposed elements thereof. FIG. 2 illustrates that this stacked, superposed relationship includes the following listed successive layers:

glass substrate 16—0.50 mm thick
chromium adhesive layer —100 Å thick
gold stripline 18—1500 Å thick
chromium adhesive layer—100 Å thick SiO insulative layer 24—12,500 Å thick
Permalloy data track 20—approximately 81% Ni-19% Fe, 350 Å thick
chromium adhesive layer—100 Å thick
gold stripline 22—1000 Å thick.

With reference back to FIG. 1, there is illustrated a shift register 12, comprised of straight-edged stripline 18, serrated-edged data track 20 and wide-narrow stripline 22. Shift register 12 is terminated at one end by generator 10, comprised of data track 20 and a terminating portion of stripline 22 having conductive elements 10a, 10b extendng from a wide portion thereof followed by a narrow portion 10c, in which the cross-tie of the cross-tie, Bloch-line pair is generated, and a wide end portion 10d. Shift register 12 is terminated on the other end by detector 14, consisting of data track 20 and a terminating portion of wide-narrow stripline 22 having conductive element 14a extending from a wide portion thereof. Following element 14a and separated therefrom is a conductive element 14b which forms the other electrode, with element 14a of detector 14, across which separation or gap 40 the presence or absence of the cross-tie is detected magneto-resistively.

In this illustrated embodiment, wide-narrow stripline 22, and its integral elements 10a, 10b, 10c, 10d, 14a, and conductive element 14b are formed during the same, e.g., vacuum deposition step of the same material and of the same thickness. This method of forming the generator, the wide-narrow propagate drive line, and the detector elements in one layer during the same process step greatly simplifies the fabrication of a complete cross-tie wall memory system. Additionally, the memory plane of the cross-tie wall memory system of FIG. 1 is symmetrical about its longitudinal axis or centerline 32 whereby current paths are symmetrical providing symmetry of the so-generated drive fields.

With particular reference to FIG. 3 and FIGS. 4a through 4i, there are presented illustrations of a timing diagram and the resultant generation, propagation and detection of cross-tie, Bloch-line pairs in the cross-tie wall memory system of FIG. 1.

The propagation of the cross-tie, Bloch-line pairs along data track 20 under the influence of the drive fields provided by the coupling of the proper current drive signals to stripline 18 and stripline 22 is in the well-known manner. This requires a store-transfer sequence of the propagation of the cross-tie and the Bloch-line within a memory cell—see the D. S. Lo, et al, U.S. Pat. No. 3,906,466. In this method of propagation, the cross-tie wall is initially formed along the geometric centerline of the data track by an in-plane field normal to the longitudinal axis of the data track. The serrated edges of the data track, when the in-plane field is removed, cause the magnetization M within the data track to collapse forming two anti-parallel magnetic domains on opposite sides of the cross-tie wall.

The combination of the pattern of the serrated edges of the data track and the design of the propagate drive line, or the wide-narrow edge pattern of stripline 22, establishes or structures the memory cells along the data track. To propagate the cross-tie, Bloch-line pairs in the well-known manner, each memory cell is required to include a store segment and a transfer segment, the order or names of which are purely arbitrary. These two segments are required due to the mechanism whereby cross-tie, Bloch-line pairs are propagated along a data track.

Initially, a cross-tie, Bloch-line pair is established in a first store segment defined by the length of one serrated edge along the data track in which the cross-tie is oriented between the narrow width or portion of the data track, and the associated Bloch-line is oriented between the two adjacent narrow portions and on the downstream side of the associated cross-tie. Next, a drive field separates the Bloch-line from the associated cross-tie, "pushing" the Bloch-line downstream into the adjacent transfer segment leaving the associated cross-tie in its initial position. Next, a nucleate drive field generates a cross-tie, Bloch-line pair between the separated cross-tie and Bloch-line. Next, an annihilate drive field annihilates the cross-tie, Bloch-line pair that is resident in the store segment effectively transferring the initial cross-tie, Bloch-line pair from the store segment into the downstream transfer segment. This sequence is repeated so that after two consecutive push-nucleate-annihilate cycles the cross-tie, Bloch-line pair has been propagated from a store segment, through a transfer segment of the same memory cell and into the store segment of the next adjacent downstream memory cell.

Thus, in the illustrated embodiment, the center of the narrow portion of wide-narrow-edged stripline 22 and the corresponding narrow portion of serrated-edged data track 20 define a store segment while the downstream center of the wide portion of wide-narrow-edged stripline 22 and the corresponding narrow portion of serrated-edged data track 20 define the transfer segment. Thus, each consecutive downstream narrow-wide segment of stripline 22 defines a memory cell comprised of a store segment and a downstream transfer segment.

Figures 4A, 4B:
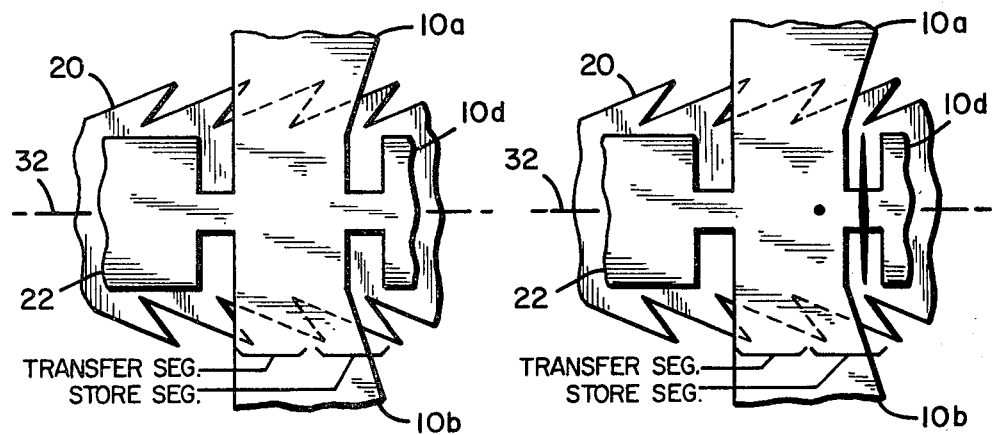
FIGS. 4a through 4i are schematic illustrations illustrating the generate/propagate/detect operations of a cross-tie, Bloch-line pair in the system of FIG. 1 as effected by the signals of the timing diagram of FIG. 3.
Figure 3:
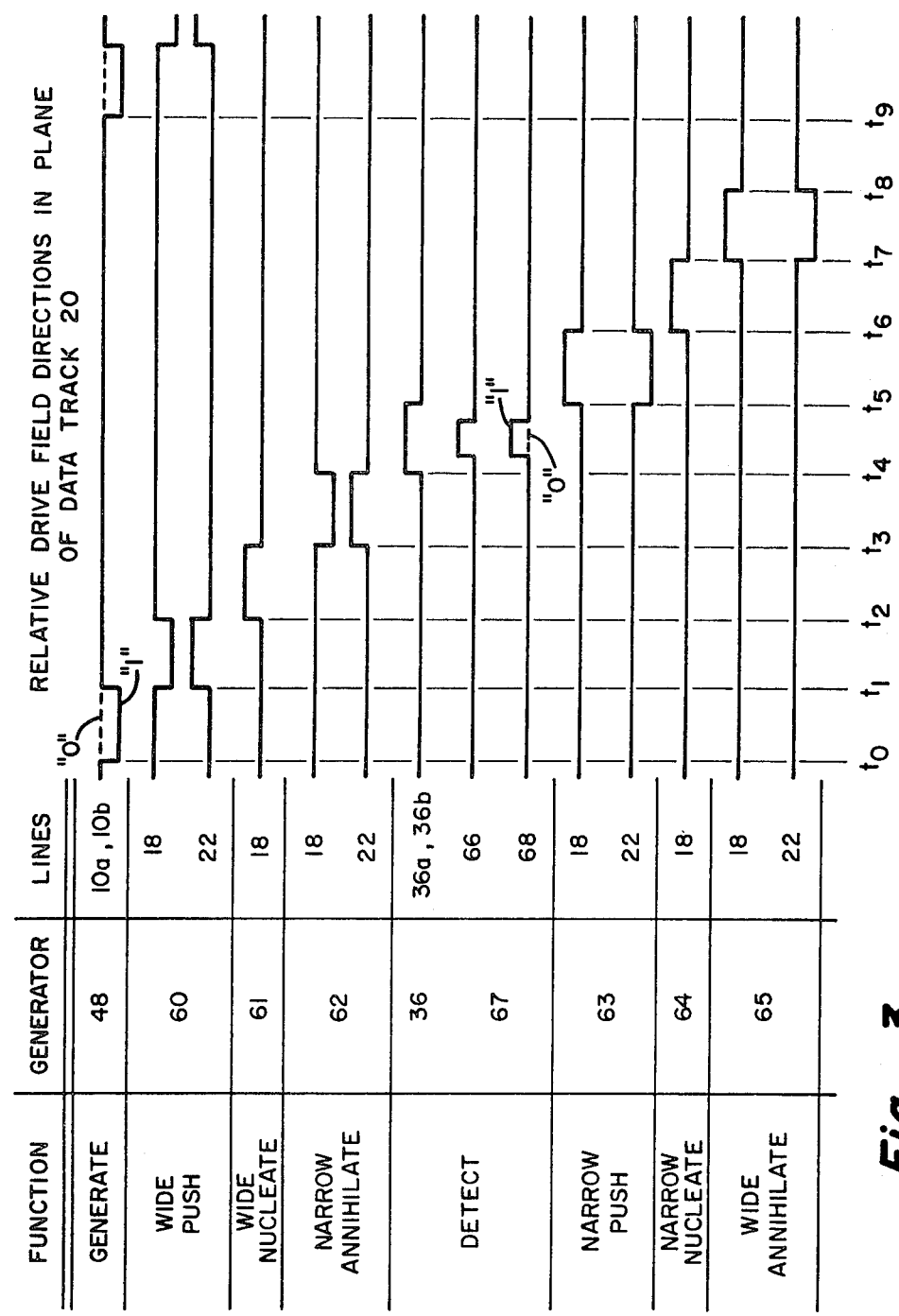
FIG. 3 is an illustration of an illustrative timing diagram for the operation of the cross-tie wall memory system of FIG. 1.

With respect to the timing diagram of FIG. 3, assume that prior to time $t_0$ the generator 10 of FIG. 1 is empty having no cross-tie, Bloch-line pair established therein. This is as indicated in FIG. 4a. Now, at a time $t_0$, generator 48 couples a Generate current signal to generator 10, via conductive elements 10a, 10b, generating a cross-tie, Bloch-line pair in generator 10. This is as illustrated in FIG. 4b. Note that generator 48 selectively couples the Generate current signal to generator 10 for the generation vel non of a cross-tie, Bloch-line pair within generator 12. In the timing diagram of FIG. 3 the generation of the cross-tie, Bloch-line pair is indicative of the significant amplitude signal representative of the storage of a "1" in the cross-tie wall memory system of FIG. 1 while the insignificant signal is indicative of the storage of a "0" in the cross-tie wall memory system of FIG. 1.

Figures 4C, 4D:
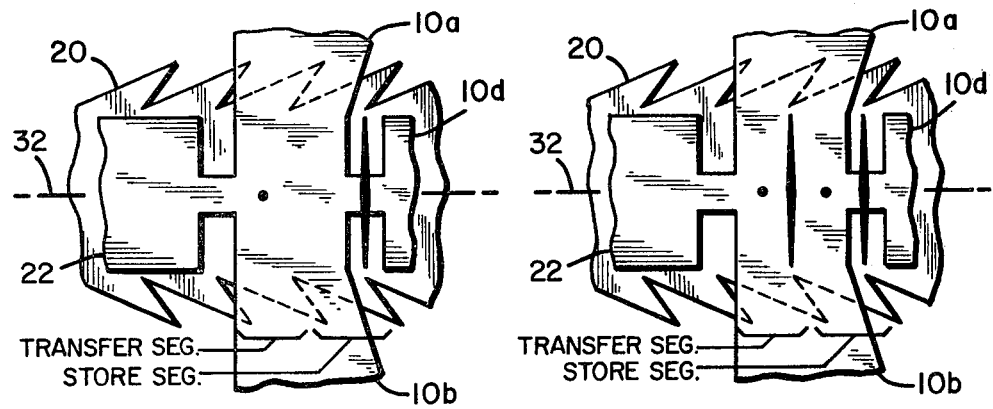

Next, at time $t_1$ with the Generate current signal terminated, generator 60, via closed normally-open switch $S_1$, couples a positive polarity Wide Push current signal to stripline 22 via conductive element 14a. Wide Push current signal flows down stripline 22 from left to right, through lines 50, 52, through stripline 18 from left to right and thence to ground. This Wide Push current signal "pushes" the Bloch-line in the store segment of the memory cell in generator 10 into the next adjacent downstream transfer segment thereof—this is as illustrated in FIG. 4c.

Figures 4E, 4G:
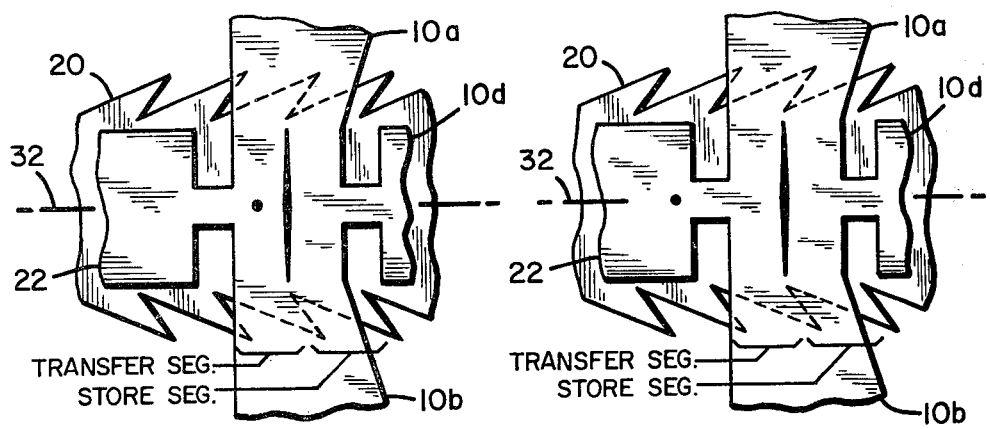
Figures 4H, 4I:
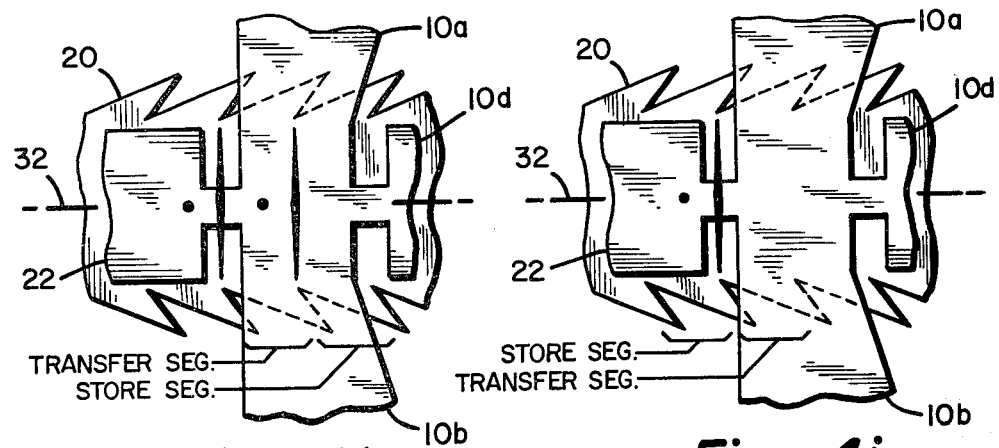
Figure 4F:
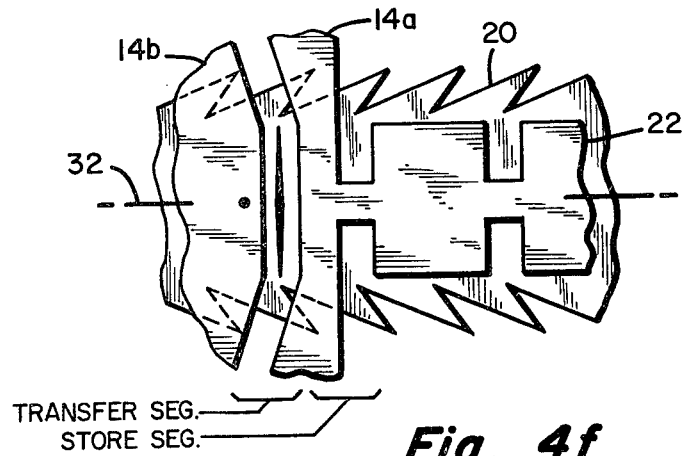
Figures 5, 6:
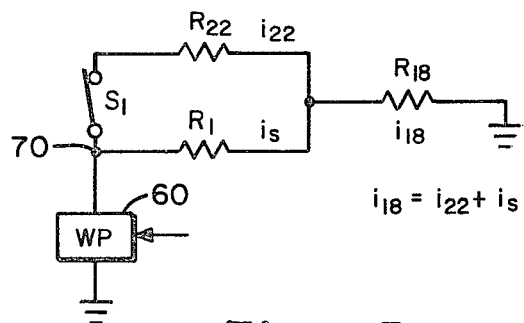
FIG. 5 is a diagrammatic circuit schematic for the push-annihilate current signals of FIG. 3.
FIG. 6 is a table of illustrative current signal durations and magnitudes for the timing diagram of FIG. 3.

With particular reference to FIG. 5, there is presented a diagrammatic circuit schematic of the equivalent circuit for the push-annihilate current generators 60, 62, 63, 65 of FIG. 1. When Wide Push current generator 60 couples the Wide Push current signal to the common point or node 70, with normally-open switch $S_1$ closed, the Wide Push current signal is coupled to the parallel combination of the resistance $R_{22}$ of stripline 22 and shunt resistance $R_S$ of resistor $R_1$ and the serially coupled resistance $R_{18}$ of stripline 18. Shunt resistor $R_S$ is, for the four operations of FIG. 4: Wide Push at time $t_1$; Narrow Annihilate at time $t_3$; Narrow Push at time $t_5$; and Wide Annihilate at time $t_7$, selected to be of the desired magnitude to provide the desired relative current magnitude of $i_{22}$ and $i_{18}$ to flow down striplines 22 and 18, respectively. When such operations are discussed herein, the shunting effect of shunt resistors $R_1$, $R_2$, $R_3$ and $R_4$ shall not be discussed in detail, it being understood that the magnitude of the, e.g., Wide Push current signal in striplines 18 and 22 are not necessarily the same because of the use of the shunt resistors. Additionally, it is to be understood that because striplines 18 and 22 are on opposite sides of data track 20, current signals of the same polarity flowing in the same direction generate drive fields in the plane of data track 20 that are of the opposite polarity as indicated in FIG. 3. Lastly, the current signals shall be discussed as following from, e.g., left to right along stripline 22 even though the polarities of the different signals, e.g., Wide Push current signal from generator 60 and Narrow Annihilate current signal from generator 62, may be opposite.

Next, at time $t_2$, with the Wide Push current signal terminated, generator 61, via line 52, couples a negative polarity Wide Nucleate current signal to stripline 18. Wide Nucleate current signal flows down stripline 18 left to right to ground. This Wide Nucleate current signal generates a new cross-tie, Bloch-line pair between the separated cross-tie, Bloch-line pair previously separated at time $t_1$—this is as illustrated in FIG. 4d.

Next, at time $t_3$, with the Wide Nucleate current signal terminated, generator 62, via closed normally-open switch $S_2$, couples a Narrow Annihilate current signal to stripline 22 via conductive element 14a. Narrow Annihilate current signal flows down stripline 22 from left to right through lines 50, 52, through stripline 18 from left to right and thence to ground. This Narrow Annihilate current signal annihilates the cross-tie, Bloch-line pair resident in the store segment of the memory cell in generator 10—this is as illustrated in FIG. 4e. The cross-tie, Bloch-line pair generated in generator 10 in the store segment of the memory cell in generator 10 has now been propagated downstream into the associated transfer segment. Note that at this time a cross-tie, Bloch-line pair if previously, as at time $t_0$, in the store segment immediately upstream of detector 14 would now be in the transfer segment of detector 14 as illustrated in FIG. 4f.

Next, at time $t_4$, with the Narrow Annihilate current signal terminated, generator 36 couples a read current signal across conductive elements 14a and 14b of detector 14. The resulting readout signal on line 68 as detected by sense amplifier 67 and as gated by the Gate Detect signal on line 66 is a function of the magneto-resistive effect of the presence or absence of a cross-tie in the transfer segment of the memory cell in gap 40 of detector 14. As under the present assumed conditions, no cross-tie is present in the transfer section of the memory cell in detector 14 between conductive elements 14a and 14b, sense amplifier 67 detects a relatively high magneto-resistive condition providing a relatively insignificant "0" output signal on line 68.

Next, at time $t_5$, with the read current signal from generator 36 terminated, generator 68, via closed normally-open switch $S_3$, couples a negative polarity Narrow Push current signal to stripline 22 via conductive element 14a. Narrow Push current signal flows down stripline 22 from left to right, through lines 50, 52, through stripline 18 from left to right and thence to ground. This Narrow Push current signal "pushes" the Bloch-line in the transfer segment of the memory cell in generator 10 into the store segment of the next downstream memory cell—this is as illustrated in FIG. 4g.

Next, at time $t_6$, with the Narrow Push current signal terminated, generator 64, via line 52, couples a negative polarity Narrow Nucleate current signal to stripline 18. Narrow Nucleate current signal flows down stripline 18 left to right to ground. This Narrow Nucleate current signal generates a new cross-tie, Bloch-line pair between the separated cross-tie, Bloch-line pair previously separated at time $t_5$. This is as illustrated in FIG. 4h.

Next, at time $t_7$, with the Narrow Nucleate current signal terminated, generator 65, via closed normally-open switch $S_4$, couples a negative polarity Wide Annihilate current signal to stripline 22 via conductive element 14a. Wide Annihilate current signal flows down stripline 22 from left to right, through lines 50, 52, through stripline 18 from left to right and thence to ground. This Wide Annihilate current signal annihilates the cross-tie, Bloch-line pair presently resident in the transfer segment of the memory cell in detector 14 leaving the now-propagated cross-tie, Bloch-line pair resident in the store segment of the next downstream memory cell from generator 10—this is as illustrated in FIG. 4i.

This push/nucleate/annihilate sequence continues propagating the cross-tie, Bloch-line pairs generated by generator 10 through the shift register 12 and into the detector 14—see FIG. 4f—from whence the information is read out in the manner as described above with particular reference to FIG. 4 at time $t_4$.

FIG. 6 is a table of illustrative current signal durations and magnitudes for the timing diagram of FIG. 4 using Bitter powder technique for observation.

What is claimed is:

1. A cross-tie wall memory system in which Bloch-line, cross-tie pairs are propagated downstream along a shift register formed of successive memory cells, comprising:
   magnetic data track means symmetrically formed about its longitudinal axis;
   electrically-conductive wide-narrow-edged first stripline means for forming successive wide, narrow portions therealong;
   said first stripline means including at its upstream end conductive first and second electrodes that are a part of and that extend substantially transversely away from one of said first stripline means wide portions, said first stripline means symmetrically formed about its longitudinal axis;
   said first stripline means and said data track means arranged with their longitudinal axes parallelly superposed;
   said data track means having two opposing edges formed into repetitive patterns of successive narrow portions that form wide portions therebetween;
   said first stripline means wide portions substantially centered about alternate ones of said data track means narrow portions and said first stripline means narrow portions substantially centered about the other alternate ones of said data track means narrow portions, successive pairs of said first stripline means narrow and wide portions forming successive memory cells of a shift register along said data track means;

a conductive third electrode symmetrically extending along the longitudinal axis of said first stripline means and forming a narrow portion, immediately upstream of said first and second electrodes, that is centered substantially about the upstream one of said data track means narrow portions for forming a generator segment thereat; and, drive current generator means coupled across said first and second electrodes and said third electrode and directing a generate current drive signal across said generator segment for generating a cross-tie in said generator segment.

2. The cross-tie wall memory system of claim 1:

said first stripline means further including at its downstream end conductive fourth and fifth electrodes formed substantially symmetrically about its longitudinal axis and that are a part of and that extend substantially transversely away from the downstream one of said stripline means wide portions;

a conductive sixth electrode formed substantially symmetrically about the longitudinal axis of and that extends substantially transversely across said data track means and that is separated from the downstream end of said first stripline means and its fourth and fifth electrodes for forming a detector gap therebetween; and, detector means coupled across said fourth and fifth electrodes and said sixth electrode and directing a detect current drive signal across said detector gap for detecting the presence or absence of a cross-tie in said detector gap.

3. The cross-tie wall memory system of claim 2 in which said first stripline means is electrically conductively affixed to said data track means.

4. The cross-tie wall memory system of claim 2 further including electrically-conductive straight-edged second stripline means arranged with its longitudinal axis superposed parallel those of said data track means and said first stripline means, said first and second stripline means sandwiching said data track means therebetween.

5. The cross-tie wall memory system of claim 4 in which said second stripline means is insulatively affixed to said electrically-affixed data track means and first stripline means.

6. A cross-tie wall memory system in which Bloch-line, cross-tie pairs are propagated downstream along a shift register formed of successive memory cells, comprising:

magnetic data track means symmetrically formed about its longitudinal axis;

electrically-conductive first stripline means;

said first stripline means including at its upstream end conductive first and second electrodes that are a part of and that extend substantially transversely away from said first stripline means longitudinal axis, said first stripline means symmetrically formed about its longitudinal axis;

said first stripline means and said data track means arranged with their longitudinal axes parallelly superposed;

said first stripline means and said data track means forming successive memory cells of a shift register along their longitudinal axes;

a conductive third electrode symmetrically extending along the longitudinal axis of said first stripline means for forming, immediately upstream of said first and second electrodes, a generator segment thereat; and, drive current generator means coupled across said first and second electrodes and said third electrode and directing a generate current drive signal across said generator segment for generating a cross-tie in said generator segment.

7. The cross-tie wall memory system of claim 6:

said first stripline means further including at its downstream end conductive fourth and fifth electrodes formed substantially symmetrically about its longitudinal axis and that extend substantially transversely away from its longitudinal axis;

a conductive sixth electrode formed substantially symmetrically about the longitudinal axis of and that extends substantially transversely across said data track means and that is separated from the downstream end of said first stripline means and its fourth and fifth electrodes for forming a detector gap therebetween; and, detector means coupled across said fourth and fifth electrodes and said sixth electrode and directing a detect current drive signal across said detector gap for detecting the presence or absence of a cross-tie in said detector gap.

8. The cross-tie wall memory system of claim 7 in which said first stripline means is electrically conductively affixed to said data track means.

9. The cross-tie wall memory system of claim 7 further including electrically-conductive straight-edge second stripline means arranged with its longitudinal axis superposed parallel those of said data track means and said first stripline means, said first and second stripline means sandwiching said data track means therebetween.

10. The cross-tie wall memory system of claim 9 in which said second stripline means is insulatively affixed to said electrically-affixed data track means and first stripline means.

* * * * *